(12) United States Patent
Simon (10) Patent No.: US 10,025,206 B2
(45) Date of Patent: Jul. 17, 2018

(54) IMPRINT LITHOGRAPHY

(71) Applicant: ASML NETHERLANDS B.V., Veldhoven (NL)

(72) Inventor: Klaus Simon, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/834,609

(22) Filed: Dec. 7, 2017

(65) Prior Publication Data

US 2018/0095361 A1    Apr. 5, 2018

Related U.S. Application Data

(63) Continuation of application No. 15/666,489, filed on Aug. 1, 2017, now Pat. No. 9,864,271, which is a continuation of application No. 13/198,425, filed on Aug. 4, 2011, now Pat. No. 9,778,563, which is a continuation of application No. 11/364,497, filed on Mar. 1, 2006, now Pat. No. 8,011,915.

(60) Provisional application No. 60/733,175, filed on Nov. 4, 2005.

(51) Int. Cl.
   *G03F 9/00*   (2006.01)
   *B82Y 40/00*  (2011.01)
   *B82Y 10/00*  (2011.01)
   *G03F 7/00*   (2006.01)

(52) U.S. Cl.
   CPC ............ *G03F 9/7042* (2013.01); *B82Y 10/00* (2013.01); *B82Y 40/00* (2013.01); *G03F 7/0002* (2013.01)

(58) Field of Classification Search
   CPC .......................... G03F 9/7042; G03F 7/0002
   See application file for complete search history.

(56) References Cited

U.S. PATENT DOCUMENTS

| | | | |
|---|---|---|---|
| 5,512,131 A | 4/1996 | Kumar et al. | |
| 5,772,905 A | 6/1998 | Chou | |
| 6,165,911 A | 12/2000 | Calveley | |
| 6,208,407 B1 | 3/2001 | Loopstra | |
| 6,262,796 B1 | 7/2001 | Loopstra et al. | |

(Continued)

FOREIGN PATENT DOCUMENTS

| | | |
|---|---|---|
| JP | 2009-192573 | 1/1996 |
| JP | 2000-289037 | 4/1999 |

(Continued)

OTHER PUBLICATIONS

European Search Report issued for European Patent Application No. 06255420.9-1226, dated Feb. 19, 2007.

(Continued)

*Primary Examiner* — Timothy Kennedy (74) *Attorney, Agent, or Firm* — Pillsbury Winthrop Shaw Pittman LLP (57) ABSTRACT

A lithographic apparatus is disclosed that has a first substrate table arranged to hold a substrate and a second substrate table arranged to hold a substrate, an imprint template holder arranged to hold an imprint template, and an imprintable medium dispenser, wherein the first substrate table is moveable between a first position located at or adjacent to the imprintable medium dispenser, and a second position located at or adjacent to the imprint template holder, and the second substrate table is moveable between the first and second positions, such that the first and second substrate tables swap positions.

20 Claims, 8 Drawing Sheets

(56) References Cited

U.S. PATENT DOCUMENTS

| | | |
|---|---|---|
| 6,309,580 B1 | 10/2001 | Chou |
| 6,334,960 B1 | 1/2002 | Willson et al. |
| 6,365,059 B1 | 4/2002 | Pechenik |
| 6,375,870 B1 | 4/2002 | Visovsky et al. |
| 6,482,742 B1 | 11/2002 | Chou |
| 6,517,995 B1 | 2/2003 | Jacobson et al. |
| 6,518,189 B1 | 2/2003 | Chou |
| 6,656,341 B2 | 12/2003 | Petersson et al. |
| 6,696,220 B2 | 2/2004 | Bailey et al. |
| 6,719,915 B2 | 4/2004 | Willson et al. |
| 6,876,439 B2 | 4/2005 | Galburt et al. |
| 6,921,615 B2 | 7/2005 | Sreenivasan et al. |
| 6,943,177 B2 | 9/2005 | Dwoskin et al. |
| 7,046,331 B2 | 5/2006 | Rossing et al. |
| 7,878,791 B2 | 2/2011 | Simon et al. |
| 2002/0093122 A1 | 7/2002 | Choi et al. |
| 2002/0094496 A1 | 7/2002 | Choi et al. |
| 2002/0132482 A1 | 9/2002 | Chou |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0127580 A1 | 7/2003 | Ling et al. |
| 2003/0139042 A1 | 7/2003 | Heidari |
| 2003/0141291 A1 | 7/2003 | Heidari et al. |
| 2003/0159608 A1 | 8/2003 | Heidari |
| 2003/0170053 A1 | 9/2003 | Montelius et al. |
| 2003/0189273 A1 | 10/2003 | Olsson |
| 2003/0211197 A1 | 11/2003 | Rossing et al. |
| 2004/0005444 A1 | 1/2004 | Heidari |
| 2004/0009673 A1 | 1/2004 | Sreenivasan et al. |
| 2004/0021866 A1 | 2/2004 | Watts et al. |
| 2004/0022888 A1 | 2/2004 | Sreenivasan et al. |
| 2004/0036201 A1 | 2/2004 | Chou et al. |
| 2004/0046288 A1 | 3/2004 | Chou |
| 2004/0081798 A1 | 4/2004 | Lee et al. |
| 2004/0124566 A1 | 7/2004 | Sreenivasan et al. |
| 2004/0149367 A1 | 8/2004 | Olsson et al. |
| 2004/0169003 A1 | 9/2004 | Lee et al. |
| 2004/0192041 A1 | 9/2004 | Jeong et al. |
| 2004/0200411 A1 | 10/2004 | Willson et al. |
| 2004/0209470 A1 | 10/2004 | Bajorek |
| 2004/0219249 A1 | 11/2004 | Chung et al. |
| 2004/0219461 A1 | 11/2004 | Chung et al. |
| 2005/0039618 A1 | 2/2005 | Heidari et al. |
| 2005/0064054 A1 | 3/2005 | Kasumi |
| 2005/0078287 A1 | 4/2005 | Sengers et al. |
| 2005/0116370 A1 | 6/2005 | Ogino et al. |
| 2005/0160011 A1 | 7/2005 | Sreenivasan et al. |
| 2005/0178280 A1 | 8/2005 | Lee et al. |
| 2006/0139614 A1 | 6/2006 | Owa et al. |
| 2006/0227312 A1 | 10/2006 | Owa et al. |
| 2007/0093079 A1 | 4/2007 | Aruga et al. |
| 2007/0132152 A1 | 6/2007 | Choi et al. |
| 2007/0170617 A1 | 7/2007 | Choi et al. |

FOREIGN PATENT DOCUMENTS

| | | |
|---|---|---|
| JP | 11-340129 | 12/1999 |
| JP | 2000-326350 | 11/2000 |
| JP | 2003-112098 | 10/2001 |
| JP | 2002-93748 | 3/2002 |
| JP | 2003-249443 | 9/2003 |
| JP | 2005-45168 | 2/2005 |
| JP | 2005-286061 | 10/2005 |
| WO | 01/79591 | 10/2001 |
| WO | 01/79592 | 10/2001 |
| WO | 2004/112108 | 12/2004 |
| WO | 2005-010986 | 2/2005 |

OTHER PUBLICATIONS

Notice of Reasons for Rejection for Japanese Patent Application No. 2006-296405 dated Jul. 16, 2009.

Notice of Reasons for Rejection for Japanese Patent Application No. 2006-296405 dated May 17, 2010.

Notice of Reasons for Rejection for Japanese Patent Application No. 2009-237982 dated Jun. 9, 2010.

European Search Report for European Patent Application No. 062554420.9, issued Apr. 27, 2007.

Stephen Y. Chou, et al., "Nanoimprint Lithography", J. Vac. Sci. Technol. B 14(6), Nov./Dec. 1996, pp. 4129-4133.

Heon Lee et al., Full Wafer Scale Near Zero Residual Nano-Imprinting Lithography Using UV Curable Monomer Solution, Microelectronic Engineering 77 (2005) pp. 42-47.

English machine translation of JP 2000-289037, provided by JPO, retrieved Nov. 24, 2010.

English machine translation of WO 2004/112108, retrieved from JPO database Jun. 22, 2010.

IMPRINT LITHOGRAPHY

This application is a continuation of U.S. patent application Ser. No. 15/666,489, filed Aug. 1, 2017, now allowed, is a continuation of U.S. patent application Ser. No. 13/198,425, filed Aug. 4, 2011, now U.S. Pat. No. 9,778,563, which is a continuation of U.S. patent application Ser. No. 11/364,497, filed on Mar. 1, 2006, now U.S. Pat. No. 8,011,915, which claims the benefit of priority of U.S. Provisional Patent Application No. 60/733,175, filed on Nov. 4, 2005, each of the foregoing applications is hereby incorporated in its entirety by reference.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

SUMMARY

According to a first aspect of the present invention there is provided an imprint lithography apparatus, comprising a first substrate table arranged to hold a substrate; a second substrate table arranged to hold a substrate; an imprint template holder arranged to hold an imprint template; and an imprintable medium dispenser, wherein the first substrate table is moveable between a first position located at or adjacent to the imprintable medium dispenser, and a second position located at or adjacent to the imprint template holder, and wherein the second substrate table is moveable between the first and second positions, such that the first and second substrate tables swap positions.

According to a second aspect of the invention there is provided an imprint lithography apparatus comprising a first substrate table arranged to hold a substrate; a second substrate table arranged to hold a substrate; an imprint template; and a dispenser configured to dispense imprintable medium, wherein the first substrate table is moveable between a first position located at or adjacent to the imprintable medium dispenser, and a second position located at or adjacent to the imprint template, and the second substrate table is moveable between the first and second positions, such that the first and second substrate tables swap positions.

According to a third aspect of the invention there is provided an imprint lithography apparatus, comprising a substrate table arranged to hold a substrate; an imprint template holder arranged to hold an imprint template; and at least two imprintable medium dispensers, a first of the imprintable medium dispensers located at or adjacent to one side of the imprint template holder, and a second of the imprintable medium dispensers located at or adjacent to an opposite side of the imprint template holder.

According to a fourth aspect of the invention there is provided an imprint lithography apparatus, comprising a substrate table arranged to hold a substrate; an imprint template; and at least two imprintable medium dispensers, a first of the imprintable medium dispensers located at or adjacent to one side of the imprint template, and a second of the imprintable medium dispensers located at or adjacent to an opposite side of the imprint template.

According to a fifth aspect of the invention there is provided an imprint lithography process, comprising moving a first substrate table holding a first substrate to a first position; aligning the substrate to the substrate table at the first position; dispensing an imprintable medium layer on the first substrate at the first position; moving the first substrate to a second position; moving a second substrate table holding a second substrate to the first position; pressing, at the second position, one or more templates in the imprintable medium layer; and aligning the second substrate to the second substrate table during at least part of the pressing.

One or more embodiments of the present invention are applicable to any imprint lithography process in which a patterned template is imprinted into an imprintable medium in a flowable state, and for instance can be applied to hot and UV imprint lithography as described above. For the purpose of understanding one or more embodiments of the present invention, it is not necessary to describe the imprint process in any more detail than has already been given and is known in the art.

Further features of one or more embodiments of the present invention will be apparent from the following description.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
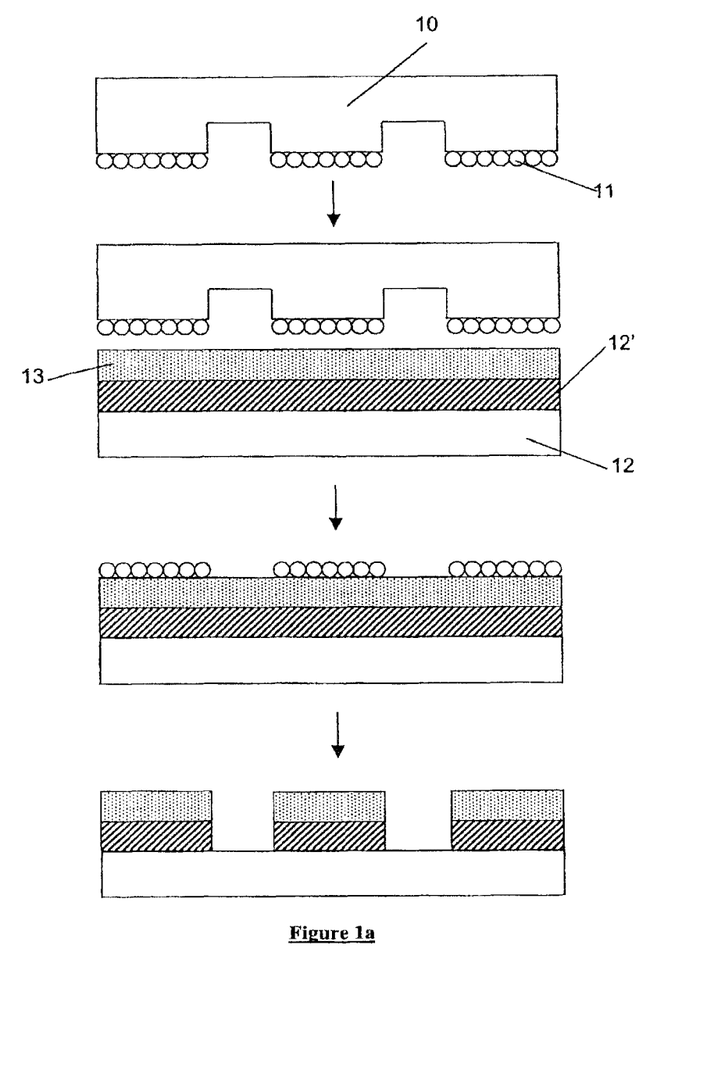
FIG. 1a-1c illustrate examples of conventional soft, hot and UV lithography processes respectively.
Figure 1B:
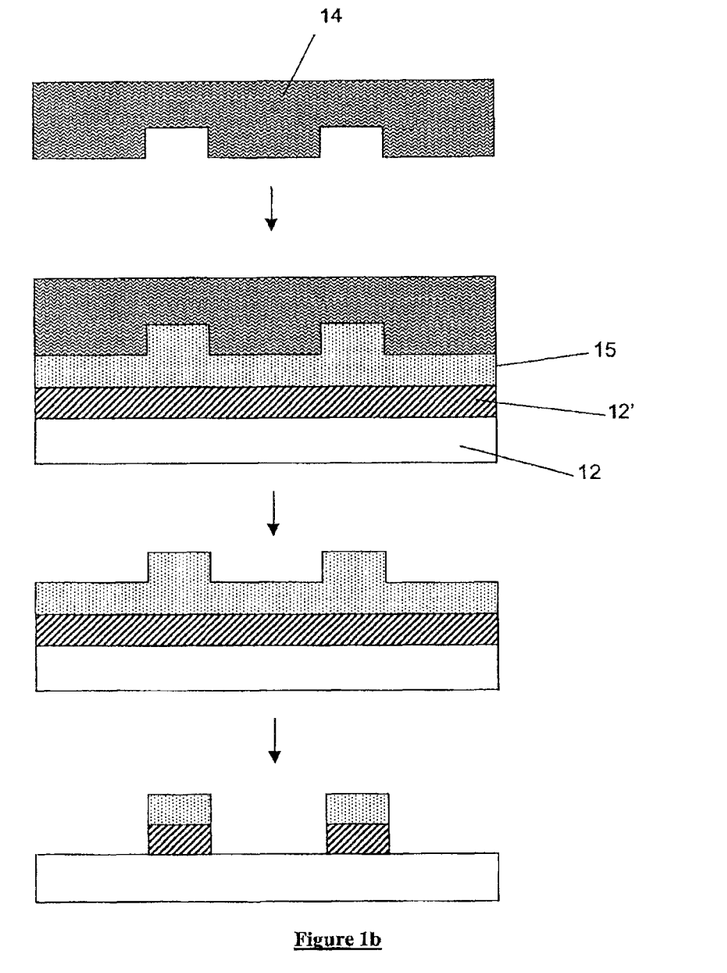
Figure 1C:
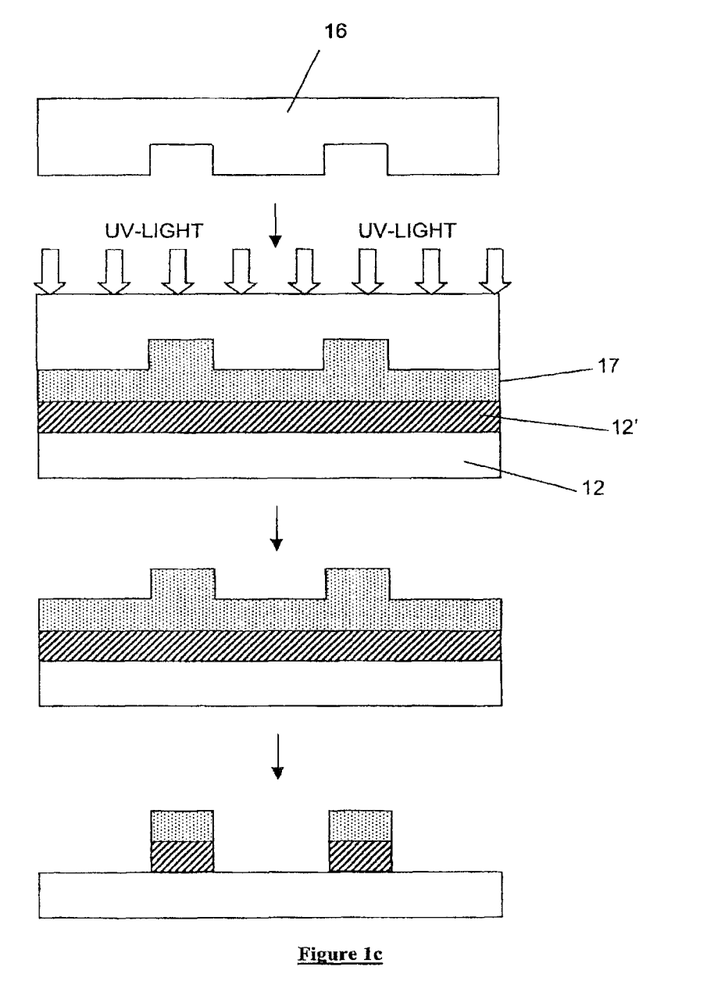

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of a substrate 12. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
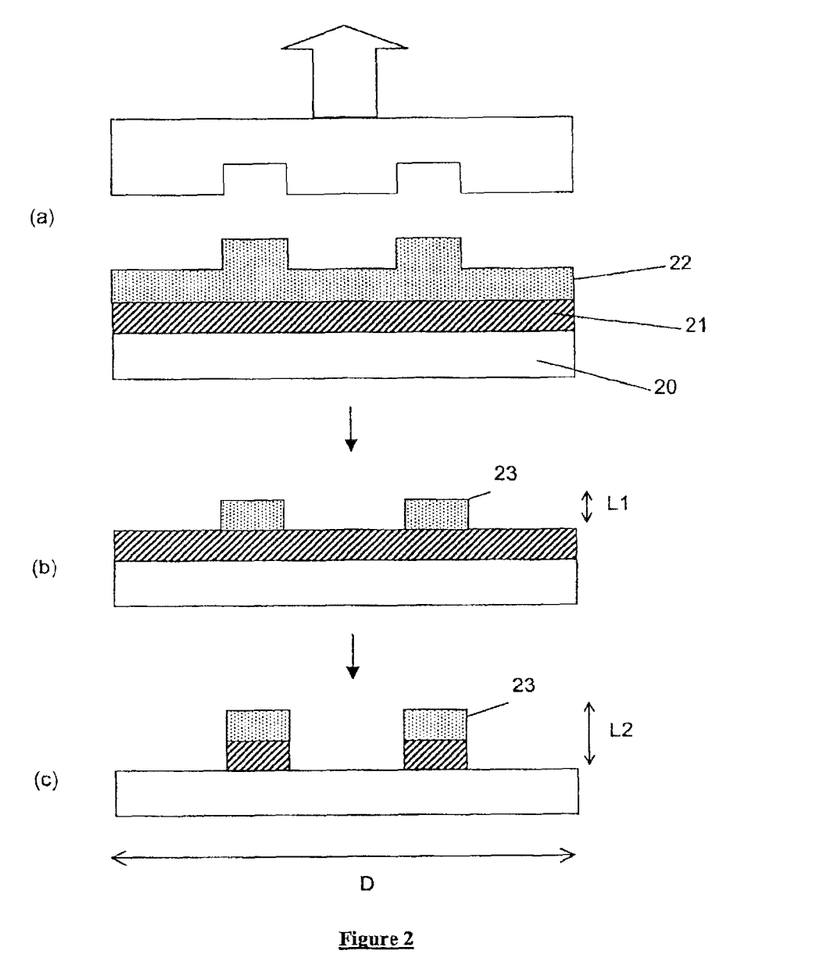
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer performed at a higher temperature, but also relatively large temperature differences might be required in order to ensure the resin is adequately solidified before the template is removed. Temperature differences between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. for example. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities. Although the name 'UV imprint lithography' implies that UV radiation is always used, those skilled in the art will be aware that any suitable actinic radiation may be used (for example, visible light may be used). Hence, any reference herein to UV imprint lithography, UV radiation, UV curable materials, etc. should be interpreted as including any suitable actinic radiation, and should not be interpreted as being limited to UV radiation only.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch fluid, the resin will have nowhere to flow.

Although reference is made herein to depositing UV curable liquids onto a substrate, the liquids could also be deposited on the template and in general the same techniques and considerations will apply.

Figure 3:
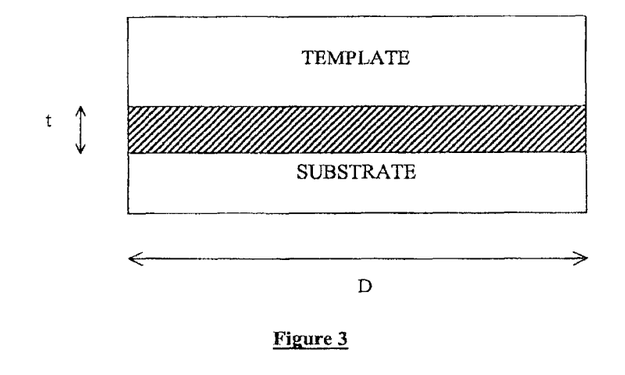
FIG. 3 schematically illustrates a template and a typical imprintable resist layer deposited on a substrate.

FIG. 3 illustrates the relative dimensions of the template, imprintable material (curable monomer, thermosetting resin, thermoplastic, etc.) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or minimum CD (critical dimension) variation is desired. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependent upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing (e.g., with an electron beam pattern generator), to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as electrical or thermal conductivity, optical linear or non-linear response, among others. For example, the functional material may form a conductive layer, a semi-conductive layer, a dielectric layer or a layer having another desirable mechanical, electrical or optical property. Some organic substances may also be appropriate functional materials. Such applications may be within the scope an embodiment of the present invention.

Figure 4:
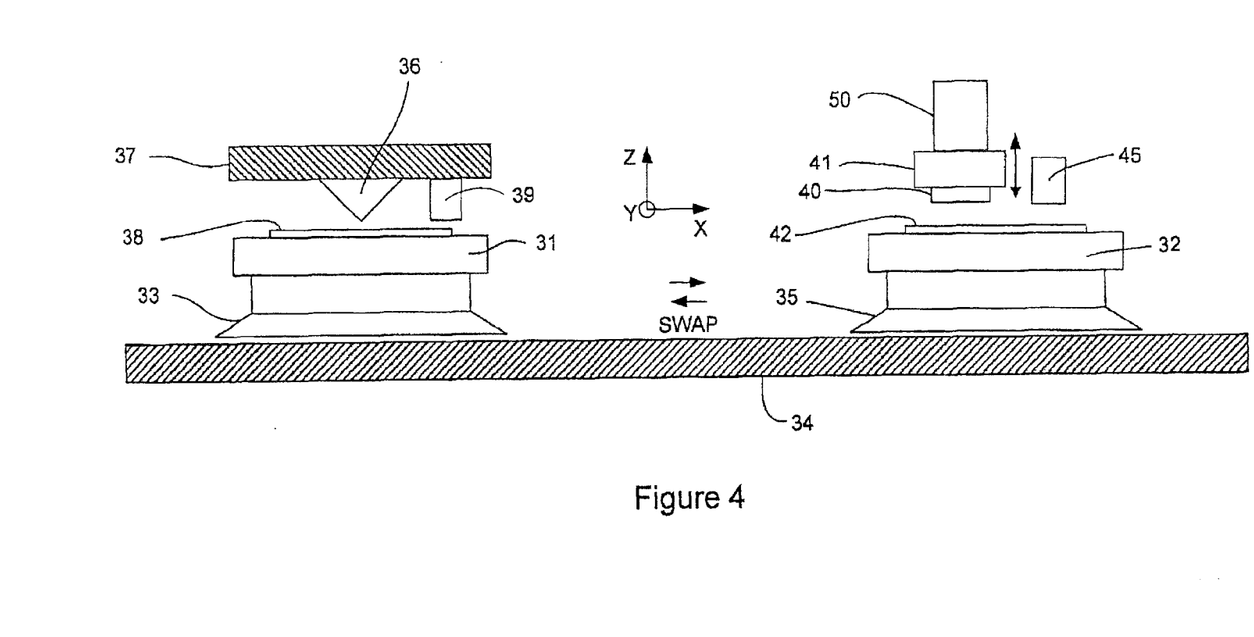
FIG. 4 schematically shows an embodiment of an imprint lithographic apparatus according to the invention.

FIG. 4 shows schematically an imprint lithography apparatus according to an embodiment of the invention. The imprint lithography apparatus comprises a first substrate table 31 and a second substrate table 32. The first substrate table 31 is provided with a gas (e.g., air) foot 33 which rests upon a base plate 34 of the apparatus. The gas foot 34 is arranged such that gas at a predetermined pressure is passed to the gas foot and establishes a cushion of gas which supports the gas foot on the base plate 33. This allows the gas foot 34 and the substrate table 31 to move smoothly over the base plate 34. The second substrate table 32 is also provided with a gas foot 35.

A dispenser 36 configured to dispense imprintable medium is fixed to a mounting 37. The imprintable medium dispenser 36 may be, for example, an inkjet nozzle which deposits droplets of imprintable medium. It may, for example, comprise an array of inkjet nozzles. Suitable configurations of inkjet nozzle arrays will be known to those skilled in the art.

A first alignment system 39, which may be, for example, an optical diffraction based system or an image recognition based system, is arranged to align one or more target portions of the first substrate 38 with respect to one or more alignment marks provided on the first substrate table 31. This may be done, for example, by determining a position of an alignment mark on the first substrate 38 with respect to an alignment mark on the first substrate table 31.

A substrate 38, referred to as the first substrate, is provided on the first substrate table 31. The substrate 38 receives droplets of imprintable medium deposited by the imprintable medium dispenser 36. The droplets of imprintable medium may be provided across the entire useable surface of the substrate 38. Alternatively, the droplets may be provided on a pre-selected portion of the substrate 38.

The second substrate table 32 is located beneath an imprint template 40 which is held in a template holder 41. A lowermost surface of the imprint template 40 is provided with a pattern. The imprint template 40 and the template holder 41 are moveable in the Z-direction, as indicated by the arrow located adjacent the imprint template holder. A substrate 42, referred to as the second substrate, is provided on the second substrate table 32.

In use, the imprintable medium dispenser 36 dispenses droplets of imprintable medium onto the first substrate 38, at the same time that the imprint template 40 is imprinting a pattern onto the second substrate 42. This process is described in more detail below.

Initially, there is no substrate provided on the first substrate table 31. A substrate handler (not illustrated) passes a substrate onto the first substrate table 31. In FIG. 4 this substrate is the first substrate 38. The first substrate 38 is positioned to within a predetermined accuracy on the first substrate table 31. This is so that all desired useable areas of the first substrate 38 may be accurately reached by the imprintable medium dispenser 36, and at a later time by the imprint template 40. A vacuum is applied through a multiplicity of openings provided in the first substrate table 31, thereby securing the first substrate 38 to the first substrate table such that it will not move over the first substrate table.

The first alignment system 39 is used to determine the position of an alignment mark on the first substrate 38 with respect to an alignment mark on the first substrate table 31. This is done by translating the first substrate table 31 beneath the alignment system 39. Deviation of the position of a target portion from its expected position is determined. Since the first substrate 38 is firmly secured to the first substrate table 31, the position of a target portion on the first substrate with respect to an alignment mark on the first substrate table 31 will not change following the alignment measurement.

The first substrate table 31 is translated through a predetermined route, such that all desired usable areas of the first substrate pass beneath the imprintable medium dispenser 36. The imprintable medium dispenser 36 dispenses droplets of imprintable medium onto the first substrate 38 while it is being translated through the predetermined route. The imprintable medium may be provided as arrays of droplets, formations of which will be apparent to those skilled in the art. The precise positions at which the droplets of imprintable medium are provided on the first substrate 38 may be determined with reference to the alignment measurement.

At the same time that imprintable medium is being provided on the first substrate 38, a pattern is being imprinted onto the second substrate 42 (the second substrate has already been provided with imprintable medium).

A second alignment system 45, which may be, for example, an optical diffraction based system or an image recognition based system, is used to measure the locations of one or more alignment marks provided on the second substrate table 32. This allows the position of a target portion of the second substrate 42 to be determined, so that it can be aligned with the imprint template 40. Once a desired target portion has been aligned with the imprint template 40, the template holder 41 is moved downward in the Z-direction until it presses the imprint template 40 into imprintable medium provided on the second substrate 42. The region of imprintable medium located beneath the imprint template 40 is then illuminated with UV radiation, which may be generated, for example, by a UV source 50.

The UV source 50, template holder 41, and imprint template 40 are arranged such that the UV radiation is only incident upon the portion of imprintable medium which is located beneath the imprint template. This may be achieved, for example, by the use of one or more screens or by appropriate application of a coating to one or more sides of the imprint template 40 and template holder 41 which is opaque to UV radiation. It will be appreciated by those skilled in the art that instead of UV radiation any suitable wavelength may be used to illuminate the imprintable medium (i.e. any suitable actinic radiation may be used). For ease of terminology the term 'UV radiation' will continue to be used in this description.

Once the imprintable medium has been cured by the UV radiation, the imprint template holder 41 and imprint template 40 are moved upwards in the Z-direction and away from the second substrate 42. The second substrate table 32 is then moved such that a second target portion is located beneath the imprint template. The imprint process is then repeated.

Instead of having an imprint template 40 which is dimensioned to imprint a single target portion of the second substrate 42, a larger imprint template may be used. For example the imprint template may be dimensioned such that the entire second substrate 42, or a substantial portion of the second substrate, is imprinted with a pattern during a single imprint process.

Once the imprinting of patterns onto the second substrate 42 has been completed, and dispensing of imprintable medium onto the first substrate 38 has been completed, the substrate tables 31 and 32 are swapped over into opposite positions. In an embodiment, this is achieved by moving the substrate tables 31, 32 (using the gas feet 33, 35) in the Y-direction so that they will not collide, then moving the first substrate table 31 in the positive X-direction and moving the second substrate table 32 in the negative X-direction. In general terms, the first substrate table moves from a first position located at or adjacent to the imprintable medium dispenser to a second position located at or adjacent to the imprint template holder. The second substrate table moves from the second position to the first position.

The precise locations of the substrate tables 31, 32 may be monitored using interferometers (not shown) when they are in the first and second positions. The interferometers may be arranged such that a first set of interferometers measure the position of the substrate table which is in the first position, regardless of which specific substrate table that is, and similarly a second set of interferometers measure the position of the substrate table which is in the second position. The interferometers need not necessarily monitor the positions of the substrate tables 31, 32 during the entire position swapping process.

The vacuum applied by the second substrate table 32 is released, so that the second substrate 42 is removable from the second substrate table. The second substrate 42 is then removed from the second substrate table 32 by the substrate handler. Following this a new substrate is placed on the second substrate table 32. The new substrate is provided with imprintable medium using the imprintable medium dispenser 36, in the manner described above.

The first substrate 38 is located beneath the imprint template 40, which is used to imprint a pattern onto the first substrate. Once depositing of imprintable medium onto the new substrate has been completed, and imprinting of the pattern onto the first substrate 38 has been completed, the substrate tables 31, 32 are once again swapped over into opposite positions (this is done in the same way as described above).

The embodiment of the invention provides, for example, an increase of throughput, since imprintable medium may be provided on a given substrate at the same time that a pattern is being imprinted onto a different substrate.

Figure 5:
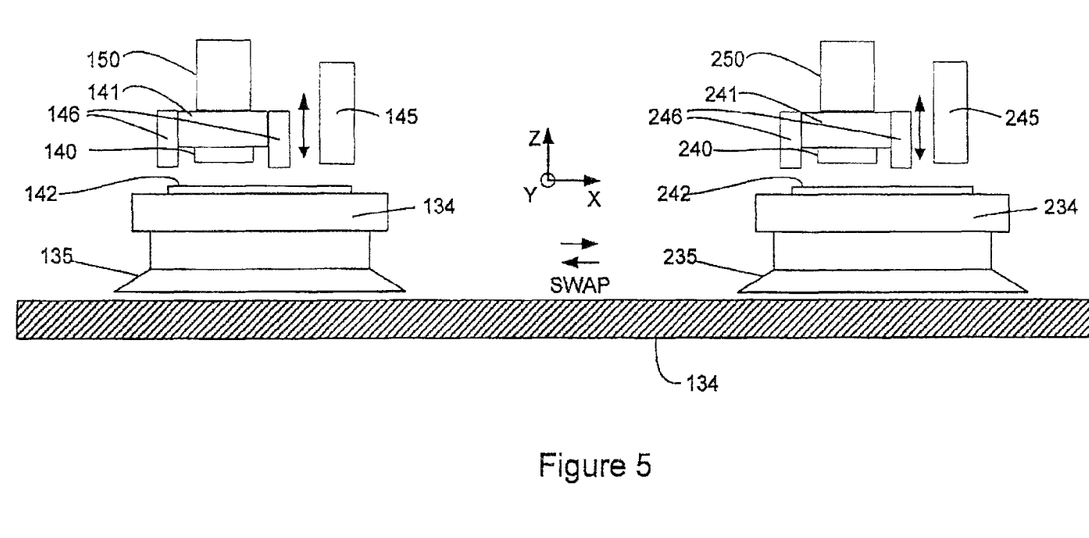
FIG. 5 schematically shows an alternative embodiment of an imprint lithographic apparatus according to the invention.

An alternative embodiment of the invention is shown schematically in FIG. 5. The embodiment shown in FIG. 5 corresponds in large part to the right hand side of FIG. 4, the principle differences being firstly that the left hand and right hand sides of FIG. 5 are substantially the same, and secondly that dispensers configured to dispense imprintable medium are provided at either side of each imprint template holder.

Referring first to the left hand side of FIG. 5, a substrate 142 is held on a substrate table 134 which is located on a gas foot 135. An imprint template holder 141 holds an imprint template 140. A UV source 150 is provided above the imprint template holder 141, and an alignment system 145 is provided to one side of the template holder. Imprintable medium dispensers 146 are provided on either side of the template holder 141.

Referring to the right hand side of FIG. 5, a substrate 242 is held on a substrate table 234 which is located on a gas foot 235. An imprint template holder 241 holds an imprint template 240. A UV source 250 is provided above the imprint template holder 241, and an alignment system 245 is provided to one side of the template holder. Imprintable medium dispensers 246 are provided on either side of the template holder 241.

The imprintable medium dispensers 146, 246 are shown viewed from below in FIG. 6. Each imprintable medium dispenser 146, 246 is provided with a series of inkjet nozzles 160. Although this is represented schematically as five openings in FIG. 6, it will be appreciated that any suitable number of inkjet nozzles may be used, and that these may be provided in a series of rows or in the form of an array instead of being provided as a single row. Other suitable apertures may be used instead of inkjet nozzles. Also shown in FIG. 6 is the underside of the imprint template holder 141, 242 and the imprint template 140, 240.

Figure 6:
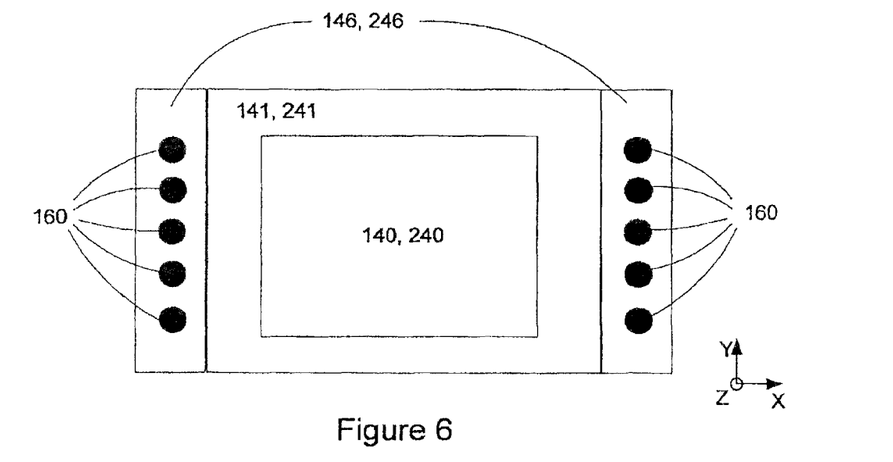
FIG. 6 schematically shows a bottom view of the imprint template holder and imprintable medium dispensers of the left hand side of FIG. 5.
Figure 7:
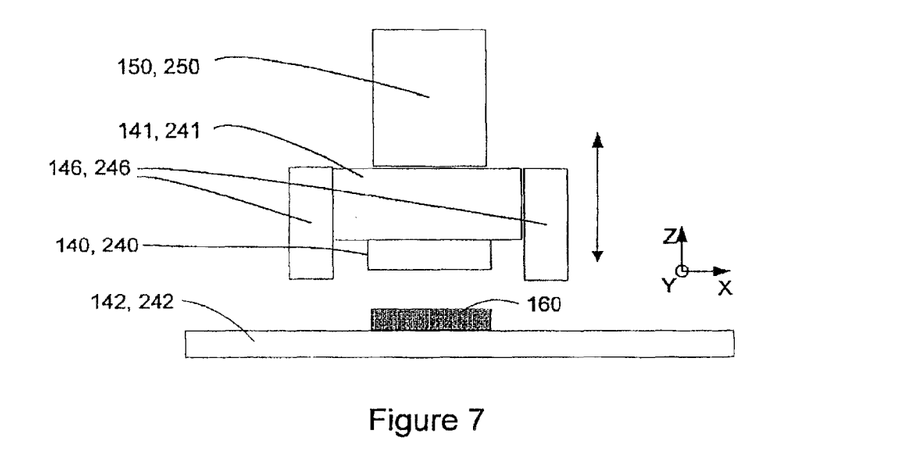
FIG. 7 schematically shows a close-up view of the left hand side of FIG. 5 in operation.

Referring to FIGS. 5 to 7, in use the substrate table 134, 234 is scanned in the X-direction beneath the imprint template 140, 240. During this scanning movement, imprintable medium is deposited onto a target portion of the substrate 142, 242 using the inkjet nozzles 160 of the left hand imprintable medium dispenser 146, 246. The supply of imprintable medium from the inkjet nozzles 160 is stopped once the target portion has been covered with imprintable medium. This is shown schematically in FIG. 7, the layer of imprintable medium being designated 161. The substrate table 134, 234 continues to move in the X-direction until the imprint template 140, 240 is located over the target portion of imprintable medium 161. The target portion of the substrate 142, 242 is thus located beneath the imprint template 140, 240 directly after it passes beneath the imprintable medium dispenser 146, 246. The imprint template 140, 240 is pressed into the imprintable medium 161, which is then illuminated using the UV source 150, 250. The imprint template 140, 240 is then removed from the imprintable medium 161, and the substrate table 134, 234 is once again scanned in the X-direction to allow further imprintable medium to be applied to the substrate 142, 242.

The term 'directly after' is intended to mean that the target portion does not pass through a significant route (e.g. scans in the positive and negative X-direction and translations in the Y-direction) before it is beneath the imprint template 140, 240. It is not intended to mean that there is no separation between the imprintable medium dispenser 146, 246 and the imprint template 140, 240.

When, at a subsequent time, the substrate table is 134, 234 is being scanned in the negative X-direction, the right hand imprintable medium dispenser 146, 246 is used to deposit imprintable medium onto the substrate 140, 240.

Referring to FIG. 5, substrates handlers (not illustrated) may be provided at either side of the apparatus, to put substrates onto the substrate tables 134 and 234, and to remove the substrates from the substrate tables. Alternatively, a single substrate handler may be used, the substrate tables 134, 234 swapping positions, as shown schematically by the arrows in the center of FIG. 5, to allow the single substrate handler to put a substrate onto and remove a substrate from both the substrate tables.

Although two UV radiation sources 150, 250 are shown, these may be replaced by a single source which is connected via suitable radiation paths to both of the imprint templates 140, 240. In one arrangement the radiation path may be configured to allow simultaneous illumination of both substrates 142, 242. Where this is done, operation of the portion of apparatus on the left hand side of FIG. 5 and the portion of apparatus of the right hand side of FIG. 5 is synchronized so that the illumination falls onto the substrates 142, 242 at the appropriate time (i.e. when the imprint templates 140, 240 are pressed onto the substrates).

In an alternative arrangement, the radiation path may be configured such that radiation may only pass to one substrate at a given time. For example this may be achieved by using a movable mirror. Where this is done, the apparatus shown in the left hand side of FIG. 5 is operated asynchronously with respect to the apparatus shown in the right hand side of FIG. 5, such that the illumination falls upon the substrate at the appropriate time. This arrangement allows a weaker UV radiation source to be used, since radiation from the source is only sent to one substrate at any given time.

Although the imprintable medium dispensers 146, 246 are shown in FIGS. 5 to 7 as being located on either X-direction side of the imprint template holder 140, 240, it will be appreciated that the imprintable medium dispensers may alternatively be located on either Y-direction side of the imprint template. The positions at which the imprintable medium dispensers 146, 246 are located may be determined by considering the direction(s) in which the substrate table 134, 234 will be moved, so that imprintable medium is provided on a given target portion of the substrate 142, 242 before that target portion is beneath the imprint template 140, 240.

In some instances it may be desired to provide the imprintable medium dispensers on each side of the imprint template holder 141, 241.

The embodiment of the invention described in relation to FIGS. 5 to 7 may provide an increased throughput because it allows imprinting of two substrates to occur simultaneously. In addition, it allows imprintable medium to be provided on the substrates just before imprinting occurs.

The imprintable medium dispensers described in relation to FIGS. 5 to 7 may be provided in an imprint lithography apparatus which includes only one substrate table.

In an embodiment, there is provided an imprint lithography apparatus, comprising: a first substrate table arranged to hold a substrate; a second substrate table arranged to hold a substrate; an imprint template holder arranged to hold an imprint template; and an imprintable medium dispenser, wherein the first substrate table is moveable between a first position located at or adjacent to the imprintable medium dispenser, and a second position located at or adjacent to the imprint template holder, and wherein the second substrate table is moveable between the first and second positions, such that the first and second substrate tables swap positions. In an embodiment, the apparatus further comprises a first alignment system located at or adjacent the imprintable medium dispenser and a second alignment system located at or adjacent to the imprint template holder. In an embodiment, the first alignment system is arranged to determine the location of one or more alignment marks on the first substrate with respect to one or more alignment marks on the first substrate table. In an embodiment, the second alignment system is arranged to determine the location of one or more alignment marks on the second substrate table, to allow one or more target portions of the second substrate to be aligned with the imprint template when held by the imprint template holder. In an embodiment, the apparatus further comprises a set of interferometers arranged to monitor the locations of the substrate tables. In an embodiment, the apparatus comprises a first set of interferometers arranged to monitor the location of whichever substrate table is at or adjacent to the imprintable medium dispenser and a second set of interferometers arranged to monitor the location of whichever substrate table is at or adjacent to the imprint template holder. In an embodiment, the substrate tables are moveable in two directions which both lie in a plane substantially perpendicular to an axis of movement of the imprint template holder. In an embodiment, the substrate tables are each supported by a gas foot. In an embodiment, the imprintable medium dispenser comprises an inkjet nozzle, or an array of inkjet nozzles.

In an embodiment, there is provided an imprint lithography apparatus comprising: a first substrate table arranged to hold a substrate; a second substrate table arranged to hold a substrate; an imprint template; and a dispenser configured to dispense imprintable medium, wherein the first substrate table is moveable between a first position located at or adjacent to the imprintable medium dispenser, and a second position located at or adjacent to the imprint template, and the second substrate table is moveable between the first and second positions, such that the first and second substrate tables swap positions.

In an embodiment, there is provided an imprint lithography apparatus, comprising: a substrate table arranged to hold a substrate; an imprint template holder arranged to hold an imprint template; and at least two imprintable medium dispensers, a first of the imprintable medium dispensers located at or adjacent to one side of the imprint template holder, and a second of the imprintable medium dispensers located at or adjacent to an opposite side of the imprint template holder.

In an embodiment, the substrate table is moveable in a scanning direction such that a target portion of the substrate is located beneath the imprint template directly after it passes beneath one of the imprintable medium dispensers. In an embodiment, the imprintable medium dispenser which is located upstream of the imprint template is arranged to provide imprintable medium onto the substrate prior to the target portion being located beneath the imprint template. In an embodiment, at least one of the imprintable medium dispensers comprises a row of apertures, a series of rows of apertures or an array of apertures. In an embodiment, the apertures are inkjet nozzles. In an embodiment, the apparatus further comprises two additional imprintable medium dispensers, such that an imprintable medium dispenser is located at or adjacent to each side of the imprint template holder. In an embodiment, the apparatus further comprises: a second substrate table arranged to hold a second substrate; a second imprint template holder arranged to hold a second imprint template; and at least two imprintable medium dispensers, a first of the imprintable medium dispensers located at or adjacent to one side of the second imprint template holder, and a second of the imprintable medium dispensers located at or adjacent to an opposite side of the second imprint template holder. In an embodiment, the positions of the first and second substrate tables may be swapped.

In an embodiment, there is provided an imprint lithography apparatus, comprising: a substrate table arranged to hold a substrate; an imprint template; and at least two imprintable medium dispensers, a first of the imprintable medium dispensers located at or adjacent to one side of the imprint template, and a second of the imprintable medium dispensers located at or adjacent to an opposite side of the imprint template.

In an embodiment, there is provided an imprint lithography process, comprising: moving a first substrate table holding a first substrate to a first position; aligning the substrate to the substrate table at the first position; dispensing an imprintable medium layer on the first substrate at the first position; moving the first substrate to a second position; moving a second substrate table holding a second substrate to the first position; pressing, at the second position, one or more templates in the imprintable medium layer; and aligning the second substrate to the second substrate table during at least part of the pressing.

While specific examples of the invention have been described above, it will be appreciated that the present invention may be practiced otherwise than as described. The description is not intended to limit the invention.

The invention claimed is:

1. An imprint lithography process, comprising:
moving a first substrate table holding a first substrate to a first position;
aligning the first substrate at the first position using a first alignment measurement system;
dispensing, using an imprintable medium dispensing system, an imprintable medium layer on the first substrate at the first position;
moving the first substrate to a second position;
moving a second substrate table holding a second substrate to the first position;
pressing, at the second position, an imprint template in the imprintable medium layer; and
aligning the second substrate during at least part of the pressing.

2. The method of claim 1, wherein the first alignment measurement system is located at or adjacent the imprintable medium dispensing system and further comprising aligning at the second position using a second alignment measurement system located at or adjacent to an imprint template holder holding the imprint template, each of the first and second alignment measurement systems configured to determine the location of one or more alignment marks on a substrate or one or more alignment marks on a substrate table.

3. The method of claim 2, wherein the first alignment measurement system determines the location of one or more alignment marks on the first or second substrate with respect to one or more alignment marks on the respective first or second substrate table.

4. The method of claim 2, wherein the second alignment measurement system determines the location of one or more alignment marks on the first or second substrate table, to allow one or more target portions of the respective first or second substrate to be aligned with the imprint template.

5. The method of claim 1, wherein second substrate table is moveable between the first and second positions, such that the first and second substrate tables swap positions.

6. The method of claim 1, further comprising pressing the imprint template onto the second substrate, wherein the first and second substrate tables are arranged such that the imprintable medium is dispensed onto the first substrate for at least a same time instance when the imprint template imprints onto the second substrate.

7. The method of claim 1, wherein an imprint template holder of the imprint template and the imprintable medium dispensing system are arranged such that the imprint template is separated from the imprintable medium dispenser by a distance at least equal to a width of the first substrate or the second substrate.

8. The method of claim 1, wherein the imprintable medium dispensing system comprises at least two imprintable medium dispensers, a first of the imprintable medium dispensers located at or adjacent to one side of an imprint template holder, and a second of the imprintable medium dispensers located at or adjacent to an opposite side of the imprint template holder.

9. The method of claim 8, further comprising:
controlling and causing the first imprintable medium dispenser to dispense imprintable medium for movement of the first or second substrate table in a first direction and not in a second direction different than the first direction; and
controlling and causing the second imprintable medium dispenser to dispense imprintable medium for movement of the respective first or second substrate table in the second direction and not in the first direction.

10. The method of claim 1, further comprising pressing, at the first position, an imprint template in an imprintable medium layer.

11. The method of claim 1, comprising using a first set of interferometers to monitor the location of whichever substrate table is at or adjacent to the imprintable medium dispenser and using a second set of interferometers to monitor the location of whichever substrate table is at or adjacent to the imprint template.

12. The method of claim 1, wherein the imprintable medium dispenser comprises an inkjet nozzle, or an array of inkjet nozzles.

13. An imprint lithography process, comprising:
aligning a first substrate on a first substrate table to the substrate table at a first position using a first alignment system;
dispensing, using an imprintable medium dispensing system, an imprintable medium layer on the first substrate at the first position;
moving the first substrate table to a second position;
aligning the first substrate or the first substrate table at the second position using a second alignment system;
pressing, at the second position, an imprint template in the imprintable medium layer; and
aligning a second substrate held by a second substrate table to the second substrate table at the first position during at least part of the pressing.

14. The method of claim 13, wherein the first alignment measurement system is located at or adjacent the imprintable medium dispensing system and the second alignment measurement system is located at or adjacent to an imprint template holder holding the imprint template, each of the first and second alignment measurement systems configured to determine the location of one or more alignment marks on a substrate or one or more alignment marks on a substrate table.

15. The method of claim 14, wherein the first alignment measurement system determines the location of one or more alignment marks on the first or second substrate with respect to one or more alignment marks on the respective first or second substrate table and wherein the second alignment measurement system determines the location of one or more alignment marks on the first or second substrate table, to allow one or more target portions of the respective first or second substrate to be aligned with the imprint template.

16. The method of claim 13, wherein second substrate table is moveable between the first and second positions, such that the first and second substrate tables swap positions.

17. The method of claim 13, further comprising pressing the imprint template onto the second substrate, wherein the first and second substrate tables are arranged such that the imprintable medium is dispensed onto the first substrate for at least a same time instance when the imprint template imprints onto the second substrate.

18. The method of claim 13, wherein an imprint template holder of the imprint template and the imprintable medium dispensing system are arranged such that the imprint template is separated from the imprintable medium dispensing system by a distance at least equal to a width of the first substrate or the second substrate.

19. The method of claim 13, wherein the imprintable medium dispensing system comprises at least two imprintable medium dispensers, a first of the imprintable medium dispensers located at or adjacent to one side of an imprint template holder, and a second of the imprintable medium dispensers located at or adjacent to an opposite side of an imprint template holder.

20. The method of claim 19, further comprising:
controlling and causing the first imprintable medium dispenser to dispense imprintable medium for movement of the first or second substrate table in a first direction and not in a second direction different than the first direction; and
controlling and causing the second imprintable medium dispenser to dispense imprintable medium for movement of the respective first or second substrate table in the second direction and not in the first direction.

* * * * *